Figure 1:
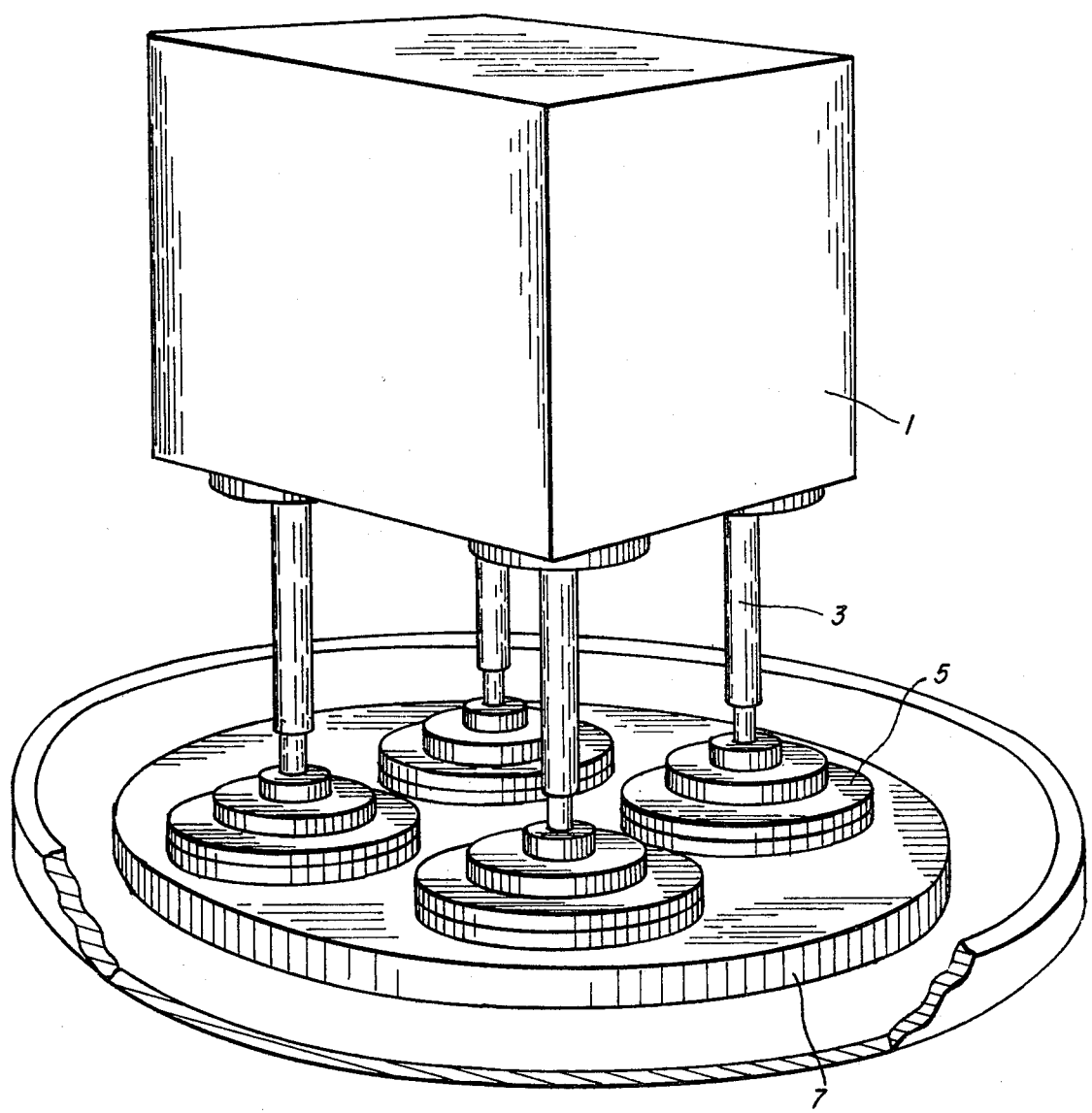

United States Patent [19]

Kinnebrew et al.

[11] 4,081,928
[45] Apr. 4, 1978

[54] SILICON SLICE CARRIER BLOCK AND PLUG ASSEMBLY

[75] Inventors: Gerald F. Kinnebrew, Dallas; Bobby Mack Watkins, Plano, both of Tex.

[73] Assignee: Texas Instruments Incorporated, Dallas, Tex.

[21] Appl. No.: 715,341

[22] Filed: Aug. 17, 1976

Related U.S. Application Data

[63] Continuation of Ser. No. 470,431, May 16, 1974, abandoned.

[51] Int. Cl.² .............................................. B24B 4/04
[52] U.S. Cl. .................................... 51/131; 51/216 R
[58] Field of Search ..................... 51/129, 131, 216 R, 51/216 LP, 236 R, 237, 283; 269/243

[56] References Cited

U.S. PATENT DOCUMENTS

| 3,103,770 | 9/1963 | Carter | 51/129 X |
|---|---|---|---|
| 3,559,346 | 2/1971 | Paola | 51/131 |
| 3,731,435 | 5/1973 | Boettcher | 51/129 |
| 3,842,544 | 10/1974 | Paola | 51/129 |

*Primary Examiner*—Harold D. Whitehead

*Attorney, Agent, or Firm*—James T. Comfort; Gary C. Honeycutt

[57] ABSTRACT

A carrier block and plug assembly for use in polishing semiconductor slices and includes a block of stainless steel onto which is secured a Delrin retainer with Delrin plugs seated on the block and within the retainer. A Mylar spacer of variable predetermined thickness is positioned between the block and retainer and around the plugs. The bottom side of the block as well as the top sides of the plug and retainer are machined to be parallel to each other. The thickness of the spacer determines the amount of the slice protruding above the retainer, thickness being based upon the thickness of the slice being polished.

The slice is placed over a plug after water or other appropriate liquid has been placed on the plug or slice to provide adhesion of the slice to the plug by surface tension, whereby the slice can freely rotate on the plug and within the retainer during polishing. Polishing takes place by mounting the block on a rotating device which rotates over and against a standard polishing pad, both block and pad rotates in the same direction. The pad is flat and parallel to the retainer surface. The slices are removed from the block after polishing by immersion in water to diminish the surface tension.

12 Claims, 2 Drawing Figures

SILICON SLICE CARRIER BLOCK AND PLUG ASSEMBLY

This is a continuation of application Ser. No. 470,431, filed May 16, 1974 and now abandoned.

This invention relates to a carrier block and plug assembly for use in polishing semiconductor slices and, or specifically, to such an assembly capable of maintaining substantial parallelism between a polishing pad and a slice which provides substantially taper-free polishing without the introduction of extraneous deleterious material, such as glass.

Semiconductor slices, such as silicon slices and the like, require parallelism between the top and bottom surfaces thereof, as well as a smooth working surface for proper formation of circuits thereon during subsequent processing steps. In the past, the parallelism has been accomplished by the well known "wax process" wherein the slice is placed in wax, which has been melted on the surface of a heated solid stainless steel block. The slice then becomes heated in the wax and is retained therein upon cooling of the wax. The wax process has provided yield problems because taper was often introduced into the polished slices due to the wax under the slices. Also, the amount of wax under each slice could not be easily controlled, thereby providing differences in the thicknesses of ground slices. In addition, the wax left a residue on the slices which had to be removed prior to processing of circuits on the slice, thus requiring additional chemical and grinding steps which were costly, and also reduced the ultimate yield.

In accordance with the present invention, there is provided apparatus for polishing semiconductor slices which substantially eliminates the problems of the prior art wax process and wherein the slices are free to rotate during polishing to provide substantially improved yield at decreased cost. Briefly, the above is accomplished by providing a block of stainless steel onto which is secured a Delrin retainer with Delrin plugs seated on the block and within the retainer. A Mylar spacer of variable predetermined thickness is positioned between the block and within the retainer. A Mylar spacer of variable predetermined thickness is positioned between the block and retainer and around the plug. The bottom side of the block as well as the top side of the plugs and retainer are machined to be parallel to each other. The thickness of the spacer determines the amount of the slice protruding above the retainer, the thickness being based upon the thickness of the slice being polished.

The slice is placed over a plug after water or other appropriate liquid has been placed on the plug or slice to provide adhesion of the slice to the plug by surface tension whereby the slice can be freely rotated on the plug and within the retainer during polishing. The polishing takes place by mounting the block on a rotating device which rotates over and against a standard polishing pad, both block and pad rotating in the same direction. The pad is flat and parallel to the retainer surface. The slices are removed from the block after polishing by immersion in water to diminish surface tension.

It is therefore an object of this invention to provide a system for polishing semiconductor slices which eliminates the use of wax.

It is a further object of this invention to provide a carrier block and plug assembly which maintains a slice substantially parallel to a polishing block.

It is yet a further object of this invention to provide a carrier block and plug assembly for polishing semiconductor slices wherein the slice can rotate freely in the assembly during polishing.

It is a still further object of this invention to provide a carrier block and plug assembly for polishing semiconductor slices capable of exposing an accurately predetermined amount of a semiconductor slice to a polishing pad.

It is an even further object of this invention to provide a carrier block and plug assembly for polishing semiconductor slices wherein the surface of the assembly component has unusual parallelism.

Figure 2:
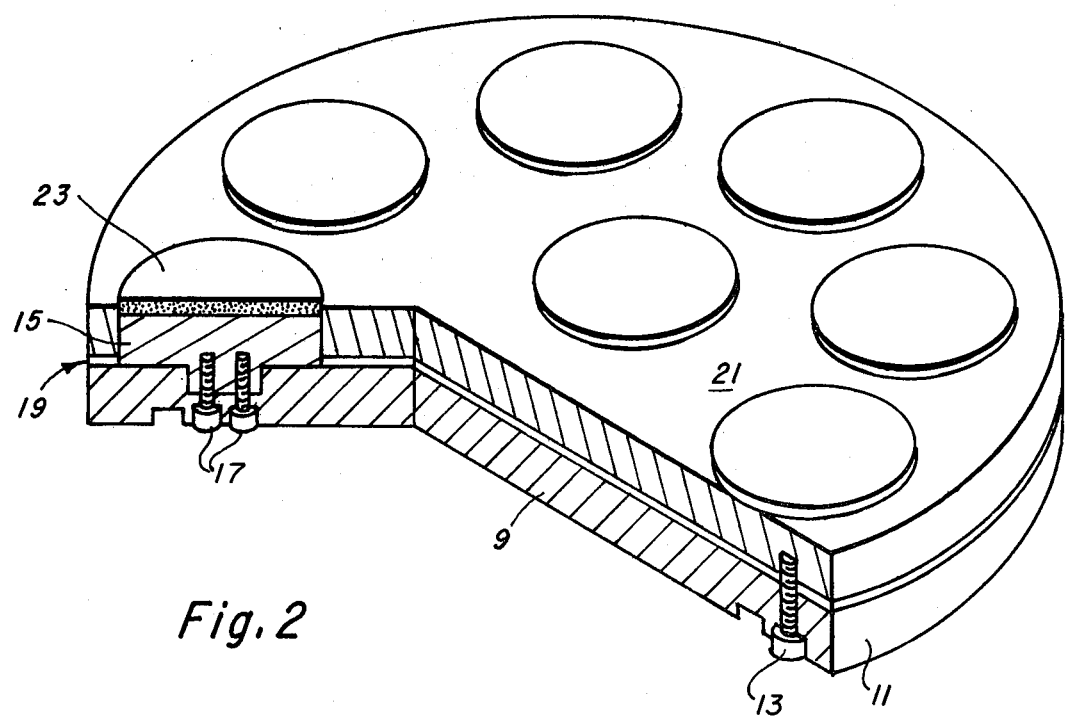

The above objects and still other objects of this invention will immediately become apparent to those skilled in the art after consideration of the following preferred embodiments thereof which is provided by way of example and not by way of limitation, wherein:

FIG. 1 is a perspective view of a semiconductor slice polishing apparatus used in the present invention; and FIG. 2 is a view, partially in elevation and partially in section, of a carrier block and plug assembly in accordance with the present invention.

The assembly 5 includes a stainless steel block 9, though it should be understood that the block 9 can be formed of any material which has rigidity and retains its shape within the temperature range of the polishing operation. A retainer 11 formed of Delrin, is secured to the block 9 by means of screws 13 which are countersunk into the block 9 and which are formed of stainless steel or any other appropriate material which has the low temperature coefficient to prevent movement of the block 9 relative to the retainer 11. Although the retainer is formed from the plastic Delrin, any material can be used which displays substantially no water absorption, is rigid, retains its shape within the temperature range of the polishing process, is softer than the semiconductor slice to be polished and has a high lubricity so that a semiconductor slice can rotate on water therein or thereon.

The retainer 11 has a plurality of circular apertures therein which receive plugs 15 therein. The plugs 15 are formed of material having the same properties as the retainer 11 and are dimensioned to substantially completely fill the apertures in the retainer. The plugs 15 are also dimensioned to have the same diameter as the semiconductor slices placed thereon for later polishing. The plugs 15 are secured to the block 9 by means of screws 17 which have the same properties as the screws 13.

The spacer 19 is positioned between the block 9 and retainer 11 and around the plug 15. The spacer 19 is formed of Mylar or any other material which is rigid, which is not compressable, and whose thickness can be accurately controlled. The thickness of the spacer 19 determines the spacing between the block 9 and retainer 11, and thereby determines the location of the upper surfaces of the plug 15 relative to the upper surface 21 of the retainer 11 or the amount of recess of the plug 15 below the surface 21. This spacing is varied by the thickness of the spacer 19, this being determined by the thickness of the slice to be polished and the amount of polishing desired.

Semiconductor slices 23 are placed over the plug 15 after placing water or other appropriate liquid on the upper surface of the plug 15 to provide surface tension and cause the slices 23 to adhere to the plug 15 but be rotatable thereon on the water. It can be seen that the slices 23 extend above the surface 21.

In the entire plug assembly, it is essential that each of the lower surfaces of the block 9, the surface 21 of the retainer 11 and the upper surfaces of the plugs 15 be parallel to each other. This can be accomplished by assembling the blocks 9, retainer 11, and plugs 15 without the spacers 25 whereby the upper surfaces of the plugs 15 and retainer 11 are coplanar, and then grinding the upper surfaces of the plugs 15 and retainer 11 so that they are parallel to the lower surface of the block 9. The spacer 15 is then added to provide the desired recess to the plugs 15.

It is desirable that all assembly components be resistive to highly alkaline environments in the range of about pH 12.5.

In operation, slice 23 is mounted on a plug 15 after water has been placed either on the bottom surface of the slice or the top surface of the plug. The assembly is then mounted in the apparatus of FIG. 1 for polishing in the manner described above. After polishing is completed, the slices are immersed in water to decrease the surface tension and permit easy removal with needle-point end tweezers.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A carrier block and plug assembly for retaining semiconductor slices for polishing which comprises:
   (a) a rigid block having a planar surface,
   (b) a retainer having parallel opposite surfaces and a plurality of apertures extending therethrough, said apertures having the same diameter throughout,
   (c) a spacer positioned between said block and retainer in the non-apertured region,
   (d) a plurality of plugs secured to said block and extending into said apertures, said plugs having substantially the same diameter as said apertures and substantially the same thickness as said retainer, thereby defining pockets having a uniform depth equal to the thickness of said spacer, said plugs each comprising means for supporting a wet semiconductor slice for free rotation thereon and consisting essentially of a rigid plastic material which is nonabsorptive and retains its shape at elevated temperatures, each plug having only a single surface exposed within its corresponding aperture, said plug surface being planar and having a high lubricity,
   (e) means securing said block to said retainer,
   (f) the exposed surfaces of said block, retainer and plugs being mutually parallel.

2. An assembly as set forth in claim 1 wherein said outer surface of said plug is positioned below the outer surface of said retainer by a distance substantially equal to the thickness of the spacer.

3. An assembly as set forth in claim 1 wherein said apertures are circular in cross-section and said plugs are circular and has a diameter substantially the same as the cross-sectional diameter of said apertures.

4. An assembly as set forth in claim 2 wherein said apertures are circular in cross-section and said plugs are circular and have a diameter substantially the same as the cross-sectional diameter of said apertures.

5. An assembly as set forth in claim 1 wherein said block retains its shape within the temperature range of the polishing operation, said retainer and plugs are formed from a material having a thermal coefficient of expansion substantially no greater than stainless steel, substantially no water absorption and being rigid but softer than the semiconductor material to be polished and said spacer being formed from a material which is rigid, not compressable and capable of having an accurately controlled thickness.

6. An assembly as set forth in claim 2 wherein said block retains its shape within the temperature range of the polishing operation, said retainer and plugs are formed from a material having a thermal coefficient of expansion substantially no greater than stainless steel, substantially no water absorption and being rigid but softer than the semiconductor material to be polished and said spacer being formed from a material which is rigid, not compressable and capable of having an accurately controlled thickness.

7. An assembly as set forth in claim 3 wherein said block retains its shape within the temperature range of the polishing operation, said retainer and plugs are formed from a material having a thermal coefficient of expansion substantially no greater than stainless steel, substantially no water absorption and being rigid but softer than the semiconductor material to be polished and said spacer being formed from a material which is rigid, not compressable and capable of having an accurately controlled thickness.

8. An assembly as set forth in claim 4 wherein said block retains its shape within the temperature range of the polishing operation, said retainer and plugs are formed from a material having a thermal coefficient of expansion substantially no greater than stainless steel, substantially no water absorption and being rigid but softer than the semiconductor material to be polished and said spacer being formed from a material which is rigid, not compressable and capable of having an accurately controlled thickness.

9. An assembly as set forth in claim 5 wherein each of said block, plugs, retainer and spacer are formed from a material substantially resistant to pH values of about 12.5.

10. An assembly as set forth in claim 6 wherein each of said block, plugs, retainer and spacer are formed from a material substantially resistant to pH values of about 12.5.

11. An assembly as set forth in claim 7 wherein each of said block, plugs, retainer and spacer are formed from a material substantially resistant to pH values of about 12.5.

12. An assembly as set forth in claim 8 wherein each of said block, plugs, retainer and spacer are formed from a material substantially resistant to pH values of about 12.5.

* * * * *